United States Patent
Tsai et al.

(10) Patent No.: US 9,768,024 B1
(45) Date of Patent: Sep. 19, 2017

(54) MULTI-LAYER MASK AND METHOD OF FORMING SAME

(71) Applicant: Taiwan Semiconductor Manufacturing Company, Ltd., Hsin-Chu (TW)

(72) Inventors: Teng-Chun Tsai, Hsin-Chu (TW);
Yung-Cheng Lu, Hsin-Chu (TW);
Ying-Tsung Chen, Hsin-Chu (TW);
Tien-I Bao, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/183,487

(22) Filed: Jun. 15, 2016

(51) Int. Cl.
*B44C 1/22* (2006.01)
*C03C 15/00* (2006.01)
*C03C 25/68* (2006.01)
*C23F 1/00* (2006.01)
*H01L 21/033* (2006.01)
*H01L 21/3105* (2006.01)
*H01L 21/027* (2006.01)
*H01L 21/311* (2006.01)
*H01L 21/02* (2006.01)

(52) U.S. Cl.
CPC ...... *H01L 21/0337* (2013.01); *H01L 21/0273* (2013.01); *H01L 21/02115* (2013.01); *H01L 21/02282* (2013.01); *H01L 21/0332* (2013.01); *H01L 21/31051* (2013.01); *H01L 21/31053* (2013.01); *H01L 21/31111* (2013.01)

(58) Field of Classification Search
USPC ................................. 216/38, 89
See application file for complete search history.

(56) References Cited

U.S. PATENT DOCUMENTS 5,914,275 A * 6/1999 Kodera ................ B24B 37/013
216/38

OTHER PUBLICATIONS

Weigand, M., et al., "Evaluating Spin-on Carbon Materials at Low Temperatures for High Wiggling Resistance," Proceedings of SPIE, vol. 8685, , Advanced Etch Technology for Nanopatterning II, 86850R, (Mar. 29, 2013), 9 pages.
Weimer, M., et al., "Materials for and Performance of Multilayer Lithography Schemes," © 2007 Society of Photo-Optical Instrumentation Engineers, 8 pages.
Wu, W.H., et al., "Use of Spin-On-Hard Mask Materials for Nano Scale Patterning Technology," Proc. of SPIE, vol. 7140, Lithography Asia 2008, 71402Q, Dec. 4, 2008, pp. 71402Q1-71402Q-12.

* cited by examiner

*Primary Examiner* — Roberts Culbert
(74) *Attorney, Agent, or Firm* — Slater Matsil, LLP

(57) ABSTRACT

A method includes forming a first insulating layer over a substrate, the first insulating layer having a non-planar top surface, the first insulating layer having a first etch rate. A second insulating layer is formed over the first insulating layer, the second insulating layer having a non-planar top surface, the second insulating layer having a second etch rate, the second etch rate being greater than the first etch rate. The second insulating layer is polished, the polishing partially removing the second insulating layer. The first insulating layer and the second insulating layer are non-selectively recessed.

20 Claims, 8 Drawing Sheets

MULTI-LAYER MASK AND METHOD OF FORMING SAME

BACKGROUND

The manufacturing of integrated circuits typically includes multiple photolithography processes. When the dimensions of the integrated circuits become increasingly smaller, the requirement for controlling the critical dimensions of the integrated circuits is also increasingly tightened. The critical dimensions are the minimum width of gate electrodes of the transistors in the wafer. The critical dimensions may be used as a reference for forming metal layers.

In conventional processes for controlling the critical dimensions (which is essentially controlling the sizes of the formed features), a tri-layer mask is formed on a wafer. The tri-layer mask includes a bottom layer, a middle layer over the bottom layer, and a photoresist over the middle layer. The photoresist is exposed using a photolithography mask, which includes opaque patterns and transparent patterns. The photoresist is then patterned through development. The patterned photoresist is used as an etching mask of the middle layer. The patterned middle layer is then used as an etching mask to etch the bottom layer. The patterned bottom layer is used as an etching mask to etch an underlying layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a multi-layer mask for a semiconductor structure and a method of forming the same. In particular, a method of planarizing a bottom layer of a multi-layer mask is described herein. The embodiments described herein are not limited to planarizing a bottom layer of a multi-layer mask and may be also used to planarize other layers of a semiconductor structure.

Figure 1A:
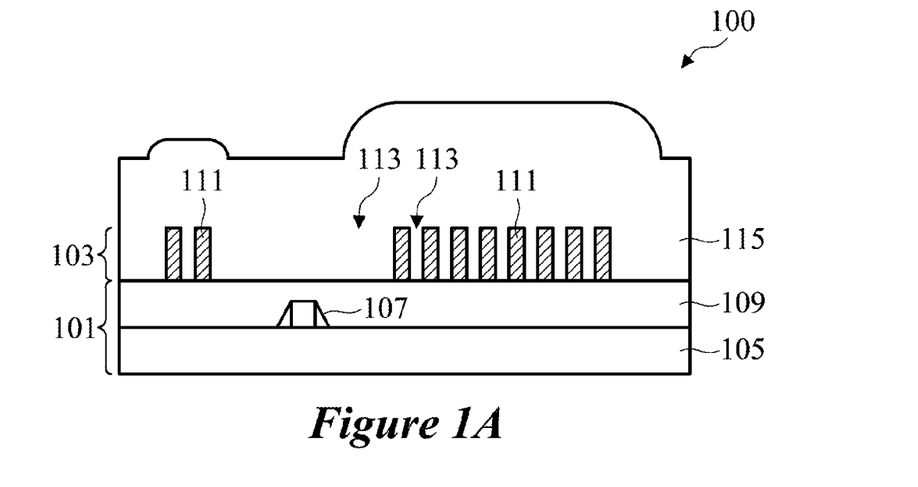
FIGS. 1A through 1E illustrate cross-sectional views of various processing steps during fabrication of a multi-layer mask in accordance with some embodiments.

FIGS. 1A through 1E illustrate cross-sectional views of various processing steps during fabrication of a multi-layer mask in accordance with some embodiments. Referring to FIG. 1A, a portion of a semiconductor structure 100 is illustrated. The semiconductor structure 100 may be an intermediate structure of an integrated circuit manufacturing process. In some embodiments, the semiconductor structure 100 may comprise a base layer 101 and a target structure 103 over the base layer 101. In some embodiments, the target structure 103 comprises a plurality of elements 111 having irregular spacings such that a density of the elements 111 over the base layer 101 is non-uniform. In the illustrated embodiment, the elements 111 have a same width and a same height. In alternative embodiments, the elements 111 may have different widths and/or different heights. Accordingly, the semiconductor structure 100 may be also referred to as a topographic semiconductor structure 100. As described below in greater detail, a multi-layer mask (not illustrated in FIG. 1A, see a multi-layer mask 125 in FIG. 1E) is formed over the target structure 103.

In some embodiments, the base layer 101 may comprise a substrate 105. The substrate 105 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 105 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 107 (illustrated in FIG. 1A as a single transistor) are formed on the substrate 105. The one or more active and/or passive devices 107 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also used as appropriate for a given application.

In some embodiments, the base layer 101 may further include an interconnect structure 109 over the one or more active and/or passive devices 107. The interconnect structure 109 may include an inter-layer dielectric (ILD) layer and/or inter-metal dielectric (IMD) layers (not individually illustrated) containing conductive features (e.g., conductive lines and vias comprising copper, aluminum, tungsten, combinations thereof, and the like) formed using any suitable method, such as damascene, dual damascene, or the like. The ILD layer and the IMD layers may include low-k dielectric materials having k values, for example, lower than about 4.0 or even 2.0 disposed between such conductive features. In some embodiments, the ILD layer and IMD layers may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spin-on coating, chemical vapor deposition (CVD), plasma-enhanced CVD (PECVD), or the like. The interconnect structure 109 electrically interconnects the one or more active and/or passive devices 107 to form functional electrical circuits within the semiconductor structure 100.

Referring further to FIG. 1A, the target structure 103 is formed over the base layer 101. In some embodiments, the base layer 101 may comprise only the substrate 105 and the one or more active and/or passive devices 107, such that the target structure 103 is formed directly over the substrate 105. The target structure 103 may comprise a plurality of strips 111 formed of a semiconductor material. In such embodiments, the plurality of strips 111 may form fins of fin field-effect transistors (FinFETs). The plurality of strips 111 may be formed using same candidate semiconductor materials as the substrate 105. In some embodiments, the plurality of strips 111 and the substrate 105 may be formed of a same semiconductor material. In alternative embodiments, the plurality of strips 111 and the substrate 105 may be formed of different semiconductor materials. In some embodiments, the plurality of strips 111 may be a part of the substrate 105. In such embodiments, the substrate 105 is patterned to form a plurality of recesses 113 such that portions of the substrate 105 between adjacent recesses 113 form the plurality of strips 111. In alternative embodiments, the plurality of strips 111 may be formed by epitaxial growing a semiconductor material on the substrate 105, for example.

In some embodiments, the target structure 103 may comprise a plurality of gates 111 of transistors that are formed on the substrate 105. In such embodiments, the base layer 101 may comprise only the substrate 105 and the one or more active and/or passive devices 107, such that the target structure 103 is formed directly over the substrate 105. In some embodiments, each of the plurality of gates 111 may include a gate dielectric layer and a gate electrode layer over the gate dielectric layer (not individually illustrated). The gate dielectric layer may comprise one or more layers of high-k dielectric materials. Generally, a high-k dielectric material has a dielectric constant (k-value) higher than 3.9. For example, the gate dielectric layer may include one or more layers of a metal oxide or a silicate of Hf, Al, Zr, combinations thereof, multi-layers thereof, or the like. Other suitable materials include La, Mg, Ba, Ti, Pb in the form of metal oxides, metal alloyed oxides, combinations thereof, or the like. In some embodiments, the gate dielectric layer may be formed using atomic layer deposition (ALD), CVD, PECVD, molecular-beam deposition (MBD), the like, or a combination thereof. The gate electrode layer may comprise a metallic material such as gold, silver, aluminum, copper, tungsten, molybdenum, nickel, titanium, alloys thereof, or the like, and may be formed using physical vapor deposition (PVD), ALD, the like, or a combination thereof. In other embodiments, conductive materials such as doped polysilicon may also be used to form the gate electrode layer.

In some embodiments, the target structure 103 may be a hard mask that is used as an etch mask while patterning a layer underlying the target structure 103. In some embodiments, the hard mask may comprise one or more layers of oxides (such as silicon oxide), nitrides (such as SiN), oxynitrides (such as SiON), the like, or combinations thereof, and may be formed using CVD, PECVD, ALD, the like, or a combination thereof. For example, the hard mask may be used to form the gates of the transistors that are formed on the substrate 105. In such embodiments, the underlying layer may comprise a gate dielectric layer and/or a gate electrode layer over the gate dielectric layer, which are formed over the substrate 105. In other embodiments, the underlying layer may be the ILD layer of the interconnect structure 109. In such embodiments, the ILD layer is patterned using the hard mask to form openings therein. The openings may be filled using suitable conductive materials to form contact plugs, which provide electrical connections to the one or more active and/or passive devices 107. In alternative embodiments, the underlying layer may be a target IMD layer of the interconnect structure 109. In such embodiments, the target IMD layer is patterned using the hard mask to form openings therein. The openings may be filled by suitable conductive materials to form interconnects, such as conductive lines and vias, in the target IMD layer. In some embodiments, the target IMD layer may be any IMD layer of the interconnect structure 109.

The particular examples of the target structure 103 and the underlying layers as described above are provided for the purpose of illustration only. In other embodiments, the target structure 103 may be any structure formed on the base layer 101, over which a multi-layer mask (such as a multi-layer mask 125 illustrated in FIG. 1A) is formed.

Referring further to FIG. 1A, a bottom layer 115 of the multi-layer mask 125 (see FIG. 1E) is formed over the target structure 103. In some embodiments, a thickness of the bottom layer 115 may be between about 0.5 KÅ and about 5 KÅ, and a top surface of the bottom layer 115 may be a non-planar surface. In some embodiments, the bottom layer 115 comprises a carbon-rich layer. In some embodiments, the bottom layer 115 may comprise a carbon-rich polymer material and may be formed using a spin-on coating method. In such embodiments, the bottom layer 115 may be also referred to as a spin-on carbon (SOC) layer 115. In alternative embodiments, the carbon-rich polymer layer may be formed using CVD, PECVD, ALD, the like, or a combination thereof. In other embodiments, the bottom layer 115 may comprise an amorphous carbon material and may be formed using CVD, PECVD, ALD, the like, or a combination thereof. In some embodiments, an atomic fraction of carbon in the bottom layer 115 is greater than about 0.5.

In some embodiments, the bottom layer 115 is annealed. The bottom layer 115 may be annealed in an annealing gas atmosphere at a temperature between about 150° C. to about 600° C. for a duration between about 1 min and about 2 hrs. The annealing gas may comprise air, $N_2$, $O_2$, $H_2$, $N_2/H_2$, $N_2/O_2$, $H_2/O_2$, combinations thereof, or the like. In some embodiments, the bottom layer 115 may be annealed using a single annealing process. In other embodiments, the bottom layer 115 may be annealed using multiple annealing processes. In some embodiments where the bottom layer 115 is annealed using two annealing processes, a first annealing process may be performed at a low temperature between about 150° C. and about 350° C. for a first duration between about 1 min and about 2 hrs, and a second annealing process may be performed at a high temperature between about 350° C. and about 600° C. for a second duration between about 1 min and about 2 hrs.

Referring further to FIG. 1A, the bottom layer 115 may have a non-uniform thickness over the base layer 101 due to the non-uniform density and/or non-uniform height of the target structure 103 over the base layer 101. In some embodiments, a thickness of the bottom layer 115 over a high-density portion of the target structure 103 is greater than a thickness of the bottom layer 115 over a low-density portion of the target structure 103. Accordingly, in some embodiments, a top surface of the bottom layer 115 may be a non-planar surface. As described below in greater detail, the top surface of the bottom layer 115 is planarized. In some embodiments, the bottom layer 115 may be formed over the base layer 101 to a thickness such that the bottom layer 115 extends above a topmost surface of the target structure 103 after planarizing the top surface of the bottom layer 115.

Figure 1B:
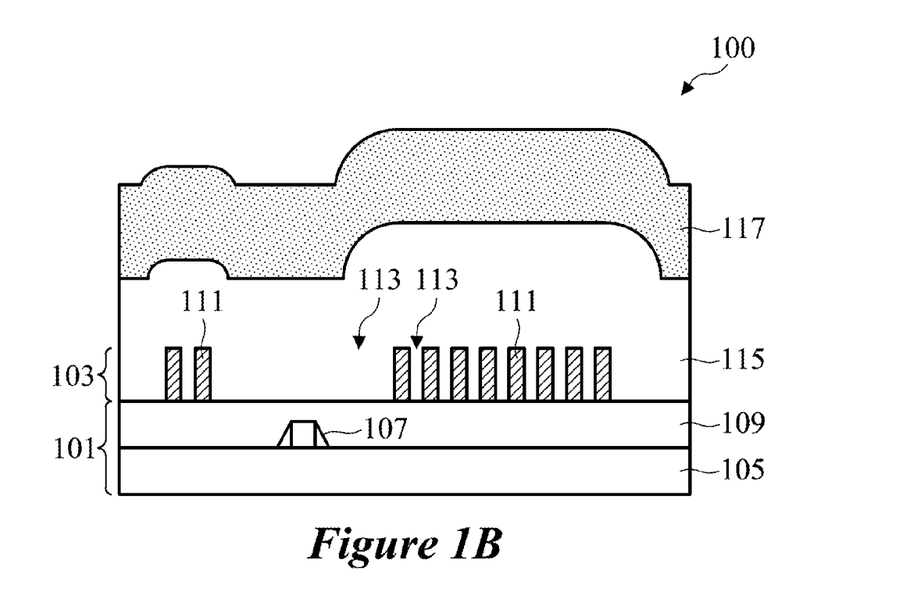

Referring to FIG. 1B, an insulating layer 117 is formed over the bottom layer 115. In some embodiment, a thickness of the insulating layer 117 may be between about 0.5 KÅ and about 5 KÅ, and a top surface of the insulating layer 117 may be a non-planar surface. In some embodiments, the insulating layer 117 may comprise a carbon-rich material. In some embodiments, the insulating layer 117 may comprise a carbon-rich polymer material and may be formed using a spin-on coating method. In such embodiments, the insulating layer 117 may be also referred to as a spin-on carbon (SOC) layer 117. In alternative embodiments, the carbon-rich polymer layer may be formed using CVD, PECVD, ALD, the like, or a combination thereof. In other embodiments, the insulating layer 117 may comprise an amorphous carbon material and may be formed using CVD, PECVD, ALD, the like, or a combination thereof. In some embodiments where the insulating layer 117 comprises a carbon-rich material, an atomic fraction of carbon in the insulating layer 117 is greater than about 0.5.

In alternative embodiments, the insulating layer 117 may comprise a dielectric material. Suitable dielectric materials may include oxides (such as silicon oxide, $HfO_2$, $ZrO_2$, $La_2O_3$, $Al_2O_3$, $TiO_2$, $Ta_2O_5$, or the like), nitrides (such as SiN, or the like), carbides (such as SiC, or the like), oxynitrides (such as SiON, AlON, or the like), oxycarbides (such as SiOC, or the like), carbonitrides (such as SiCN, or the like), oxycarbonitrides (such as SiONC, or the like), combinations thereof, or the like. The dielectric materials may be formed using spin-on coating, CVD, PECVD, ALD, the like, or a combination thereof.

In some embodiments, the insulating layer 117 is annealed. The annealing process may be performed in an annealing gas atmosphere at a temperature between about 150° C. to about 600° C. for a duration between about 1 min and about 2 hrs. The annealing gas may comprise air, $N_2$, $O_2$, $H_2$, $N_2/H_2$, $N_2/O_2$, $H_2/O_2$, combinations thereof, or the like. In some embodiments, the insulating layer 117 is annealed using a single annealing process. In other embodiments, the insulating layer 117 may be annealed using multiple annealing processes. In some embodiments where the insulating layer 117 is annealed using two annealing processes, a first annealing process may be performed at a low temperature between about 120° C. and about 350° C. for a first duration between about 1 min and about 2 hrs, and a second annealing process may be performed at a high temperature between about 350° C. and about 600° C. for a second duration between about 1 min and about 2 hrs.

In some embodiments, materials for the insulating layer 117 and the bottom layer 115 may be chosen such that an etch rate of the insulating layer 117 may be greater than an etch rate of the bottom layer 115. In some embodiment, an etch selectivity of the insulating layer 117 over the bottom layer 115 is greater than about 4.

Figure 1C:
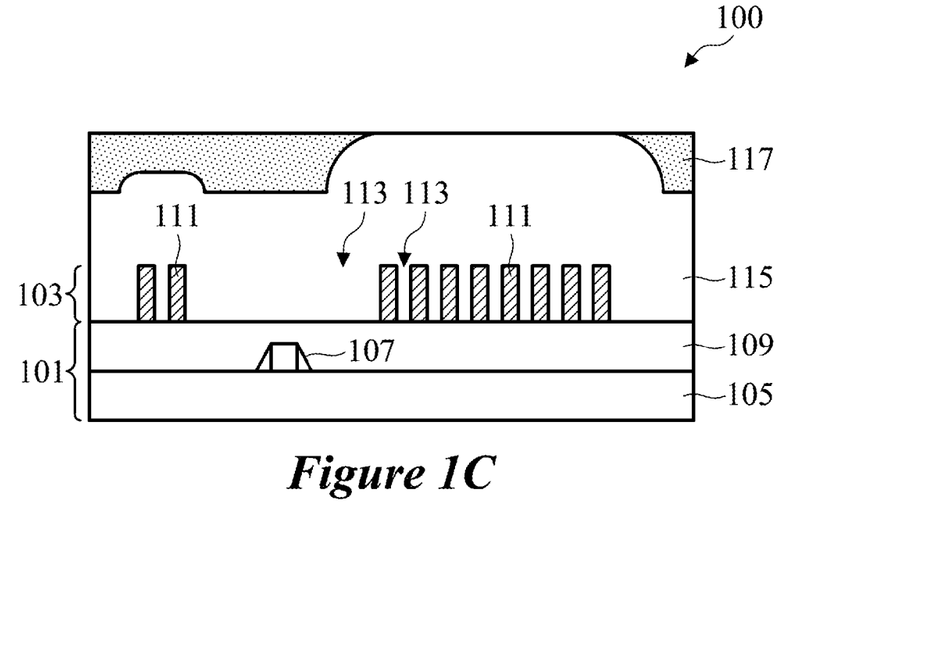

Referring to FIG. 1C, the insulating layer 117 is polished to planarize a top surface of the semiconductor structure 100. In some embodiments, the insulating layer 117 may be planarized using chemical-mechanical polishing (CMP). In some embodiments where the etch rate of the insulating layer 117 is greater than an etch rate of the bottom layer 115, the planarization process may stop when the bottom layer 115 is exposed. In alternative embodiments, the polishing process may include grinding, etching, the like, or a combination thereof.

Figure 1D:
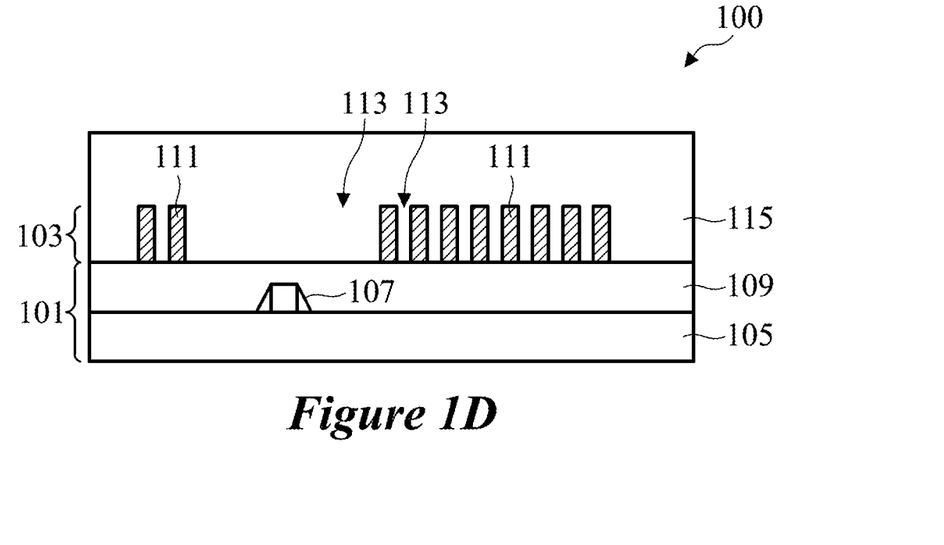

Referring to FIG. 1D, after polishing the top surface of the semiconductor structure 100, the insulating layer 117 and the bottom layer 115 are etched such that the insulating layer 117 is completely removed from the bottom layer 115 and a thickness of the bottom layer 115 is reduced. In some embodiments, the etch process non-selectively removes the insulating layer 117 and the bottom layer 115. Due to non-selectivity of the etch process, the planar top surface of the semiconductor structure illustrated in FIG. 1C is transformed into a planar top surface of the bottom layer 115. In some embodiments where the insulating layer 117 and the bottom layer 115 comprise a SOC material, the etch process may be a dry etch process performed using a mixture of $O_2$ and $N_2$ gasses, a mixture of $CO_2$ and Ar gasses, or the like.

In some embodiments, the insulating layer 117 and the bottom layer 115 may be optionally annealed before etching the insulating layer 117 and the bottom layer 115. The annealing process may improve the non-selectivity of the etch process for etching the insulating layer 117 and the bottom layer 115. In some embodiments, the annealing process alters the etch rates of the insulating layer 117 and the bottom layer 115, such that the difference between the etch rate of the insulating layer 117 and the etch rate of the bottom layer 115 is reduced. In some embodiments, after the annealing process, the etch selectivity of the insulating layer 117 over the bottom layer 115 is between about 0.25 and about 4.0.

Figure 1E:
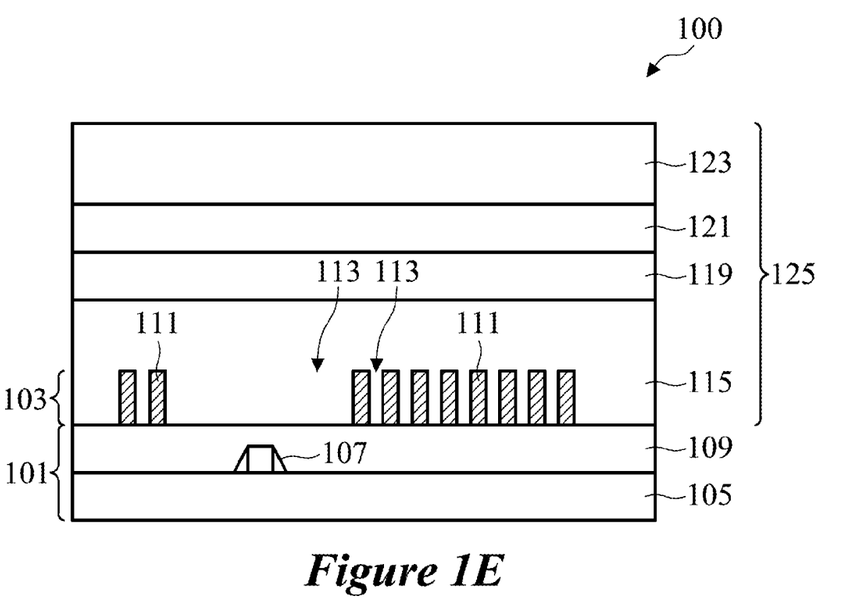

Referring to FIG. 1E, a first middle layer 119 is formed over the bottom layer 115. In some embodiments, the first middle layer 119 may comprise an inorganic silicon-containing material, such as silicon oxycarbide (SiOC), or the like. An atomic fraction of silicon in the first middle layer 119 may be greater than about 0.1. In some embodiments, the first middle layer 119 may be formed using spin-on coating, CVD, PECVD, ALD, the like, or a combination thereof. In some embodiments, the first middle layer 119 may act as an inorganic hard mask layer. In other embodiments, the first middle layer 119 may act as an inorganic bottom anti-reflective coating (BARC) layer. In an embodiment, the first middle layer 119 is formed to a thickness between about 0.1 KÅ and about 2 KÅ. In some embodiments, a second middle layer 121 is formed over the first middle layer 119. In some embodiments, the second middle layer 121 may act an organic bottom anti-reflective coating (BARC) layer. In some embodiments, the second middle layer 121 may comprise a suitable organic material and may be formed using spin-on coating, or the like. The second middle layer 121 is formed to a thickness sufficient to provide sufficient antireflective qualities based upon the materials and the wavelength. In an embodiment, the second middle layer 121 is formed to a thickness of between about 0.1 KÅ and about 2 KÅ. In alternative embodiments, the second middle layer 121 may be omitted.

Referring further to FIG. 1E, a top layer 123 is formed over the second middle layer 121. In some embodiment, the top layer 123 comprises a photoresist material and may be formed using spin-on coating, or the like. In an embodiment, the top layer 123 is formed to a thickness of between about 0.1 KÅ and about 2 KÅ. In some embodiment, the bottom layer 115, the first middle layer 119, the second middle layer 121, and the top layer 123 form the multi-layer mask 125. In other embodiments where the second middle layer 121 is omitted, the bottom layer 115, the first middle layer 119, and the top layer 123 form the multi-layer mask 125. In some embodiments, the multi-layer mask 125 is patterned to form a desired pattern in the bottom layer 115. Subsequently, the target structure 103 is patterned using the patterned bottom layer 115 layer as an etch mask.

Figure 2:
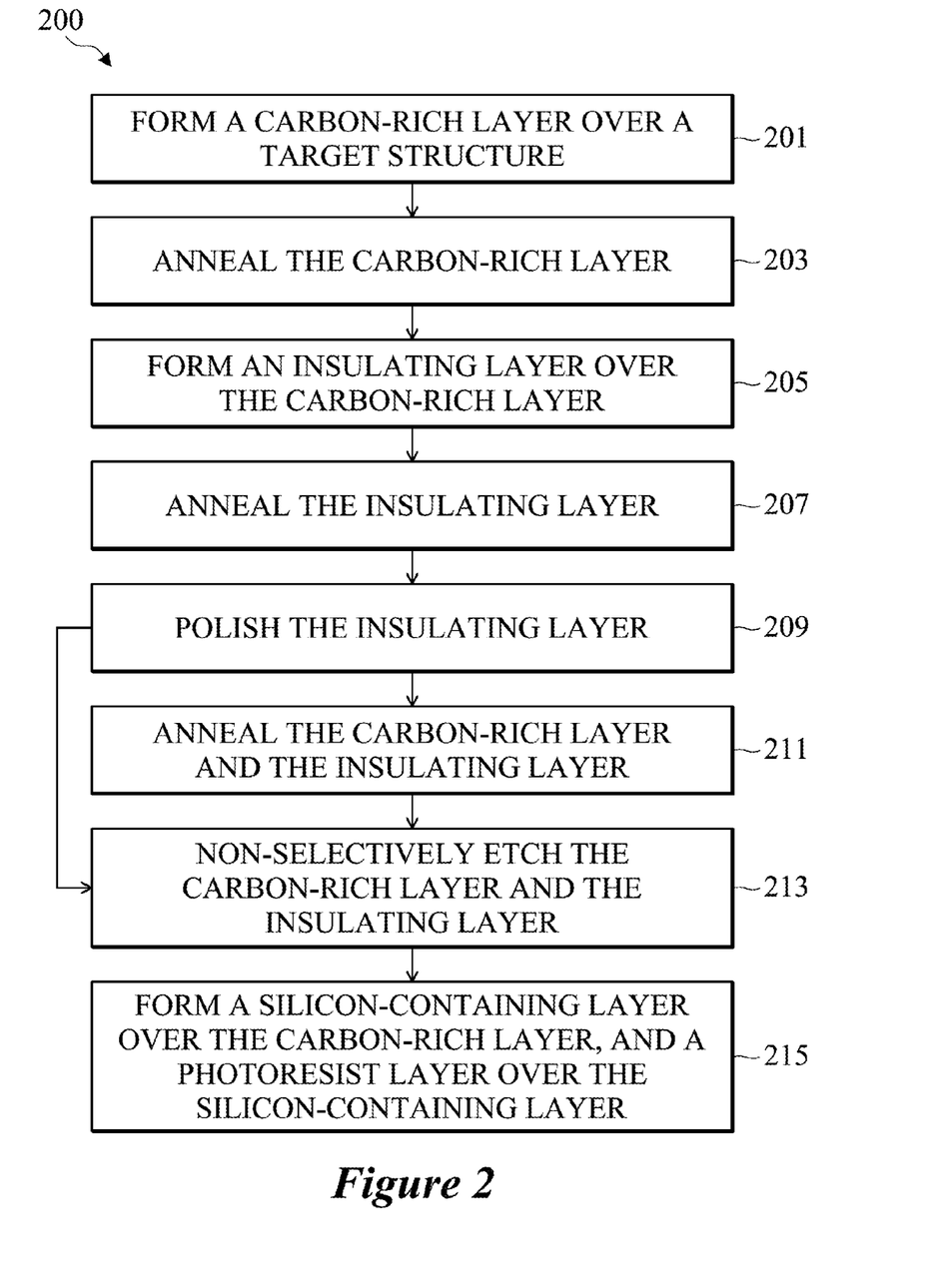
FIG. 2 is a flowchart illustrating a method of manufacturing a multi-layer mask in accordance with some embodiments.

FIG. 2 is a flowchart illustrating a method 200 of manufacturing a multi-layer mask in accordance with some embodiments. The method starts with step 201, where a carbon-rich layer (such as the bottom layer 115 illustrated in FIG. 1A) is formed over a target structure (such as the target structure 103 illustrated in FIG. 1A) as described above with reference to FIG. 1A. In step 203, the carbon-rich layer is annealed as described above with reference to FIG. 1A. In step 205, an insulating layer (such as the insulation layer 117 illustrated in FIG. 1B) is formed over the carbon-rich layer as described above with reference to FIG. 1B. In step 207, the insulating layer is annealed as described above with reference to FIG. 1B. In step 209, the insulating layer is polished as described above with reference to FIG. 1C. In step 211, the carbon-rich layer and the insulating layer are annealed as described above with reference to FIG. 1C. In other embodiments, step 211 may be omitted and the step 209 directly continues to step 213. In step 213, the carbon-rich layer and the insulating layer are non-selectively etched as described above with reference to FIG. 1D. In step 215, a silicon-containing layer (such as the first middle layer 119 illustrated in FIG. 1E) is formed over the carbon-rich layer, and a photoresist layer (such as the top layer 123 illustrated in FIG. 1E) is formed over the silicon-containing layer as described above with reference to FIG. 1E. In alternative embodiments, in step 215, an organic BARC layer (such as the second middle layer 121 illustrated in FIG. 1E) may be optionally formed between the silicon-containing layer and the photoresist layer as described above with reference to FIG. 1E.

FIGS. 3A through 3F illustrate cross-sectional views of various processing steps during fabrication of a multi-layer mask in accordance with some embodiments. Embodiments of FIGS. 3A-3F are similar to embodiments of FIGS. 1A-1E and include similar elements. Description of commonly numbered elements applies to all instances of the commonly number elements and will not be repeated in the interest of brevity. In the illustrated embedment, an etch stop layer 301 (see FIG. 3B) is formed between the bottom layer 115 and the insulating layer 117 to aid a polishing process of the insulating layer 117 as described in greater detail below.

Figure 3A:
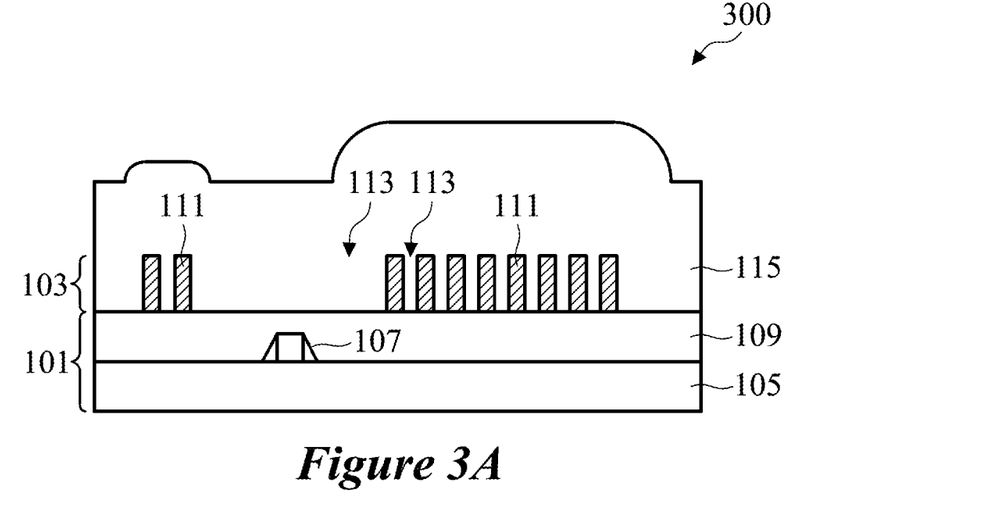
FIGS. 3A through 3F illustrate cross-sectional views of various processing steps during fabrication of a multi-layer mask in accordance with some embodiments.

FIG. 3A illustrates a portion of a semiconductor structure 300. The semiconductor structure 300 may be an intermediate structure of an integrated circuit manufacturing process. In some embodiments, the semiconductor structure 300 comprises a base layer 101 and a target structure 103 over the base layer 101. The base layer 101 comprises, a substrate 105, one or more active and/or passive devices 107 on the substrate 105, and an interconnect structure 109 over the one or more active and/or passive devices 107.

Referring further to FIG. 3A, a bottom layer 115 of the multi-layer mask 125 (see FIG. 3F) is formed over the target structure 103 and is annealed. In some embodiments, the bottom layer 115 is formed and annealed using similar methods as described above with reference to FIG. 1A and the description is not repeated herein.

Figure 3B:
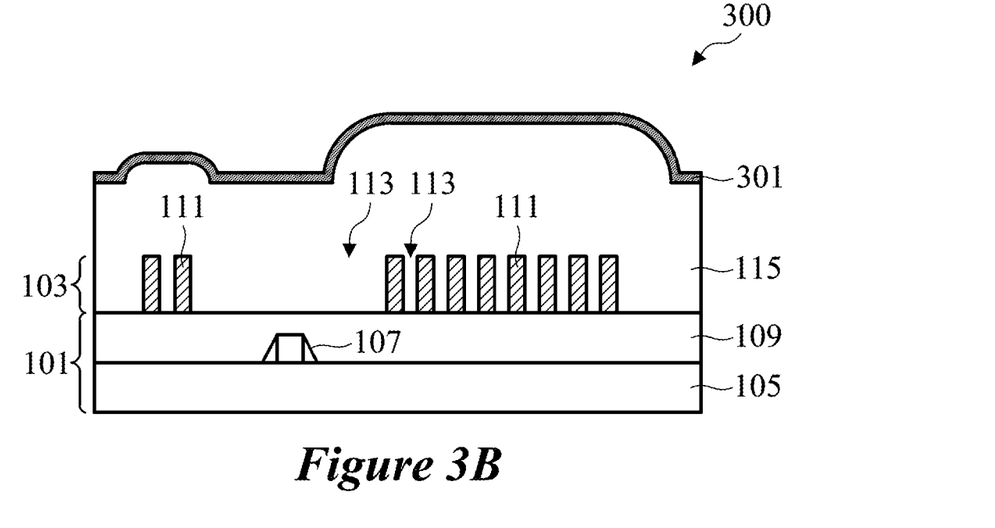

Referring to FIG. 3B, an etch stop layer 301 is formed over the bottom layer 115. The etch stop layer 301 may comprise a dielectric material. Suitable dielectric materials may include oxides (such as silicon oxide, $HfO_2$, $ZrO_2$, $La_2O_3$, $Al_2O_3$, $TiO_2$, $Ta_2O_5$, or the like), nitrides (such as SiN, or the like), carbides (such as SiC, or the like), oxynitrides (such as SiON, AlON, or the like), oxycarbides (such as SiOC, or the like), carbonitrides (such as SiCN, or the like), oxycarbonitrides (such as SiONC, or the like), combinations thereof, or the like. The dielectric materials may be formed using spin-on coating, CVD, PECVD, ALD, the like, or a combination thereof. In some embodiments, the etch stop layer 301 may be formed to a thickness of between about 2 nm and about 50 nm, and a top surface of the etch stop layer 301 may be a non-planar surface. In some embodiments, a material for the etch stop layer 301 is chosen such that an etch rate of the etch stop layer 301 is less than an etch rate of the insulation layer 117 (see FIG. 3C) that is subsequently formed over the etch stop layer 301. As described below in greater detail, the etch stop layer 301 is used to aid a polishing process of the insulating layer 117.

Figure 3C:
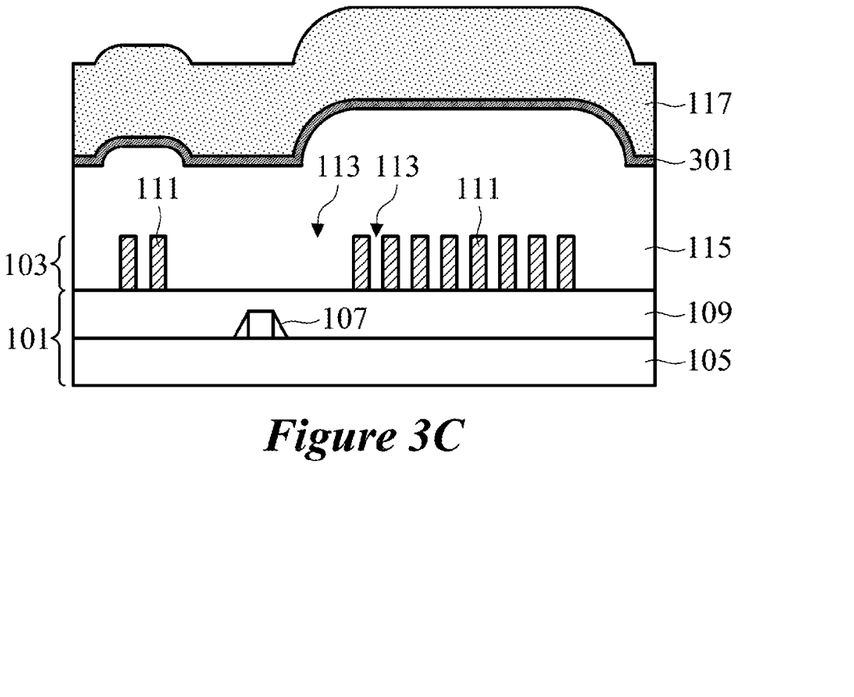

Referring to FIG. 3C, an insulating layer 117 is formed over the etch stop layer 301 and is annealed. In some embodiments, the insulating layer 117 is formed and annealed using similar methods as described above with reference to FIG. 1B and the description is not repeated herein. In some embodiments, materials for the insulating layer 117 and the etch stop layer 301 may be chosen such that an etch rate of the insulating layer 117 is greater than an etch rate of the etch stop layer 301. In some embodiment, an etch selectivity of the insulating layer 117 over the etch stop layer 301 is greater than about 4.

Figure 3D:
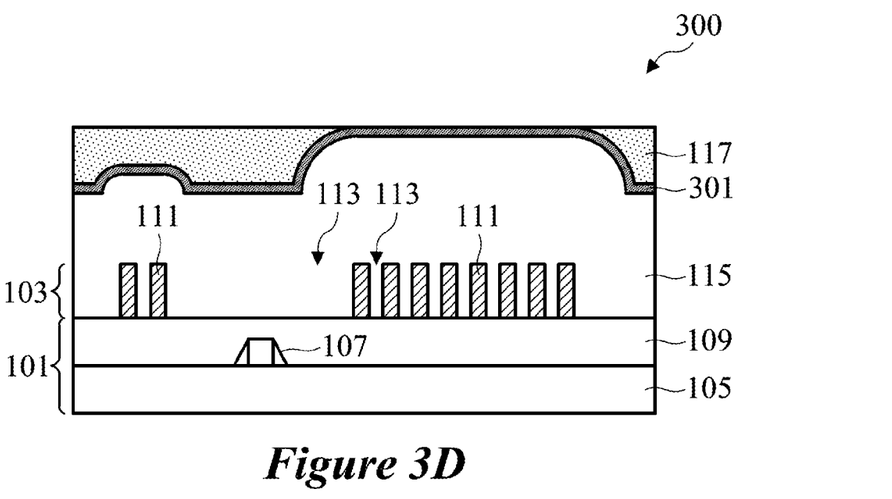

Referring to FIG. 3D, the insulating layer 117 is polished to planarize a top surface of the semiconductor structure 300. In some embodiments, the insulating layer 117 may be planarized using chemical-mechanical polishing (CMP). In some embodiments where the etch rate of the insulating layer 117 is greater than the etch rate of the etch stop layer 301, the planarization process may stop when the etch stop layer 301 is exposed. In alternative embodiments, the polishing process may include grinding, etching, the like, or a combination thereof.

Figure 3E:
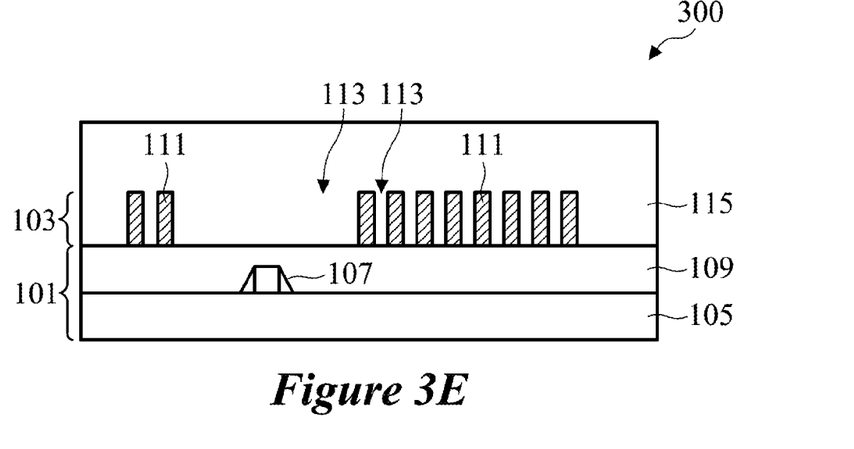
Figure 3F:
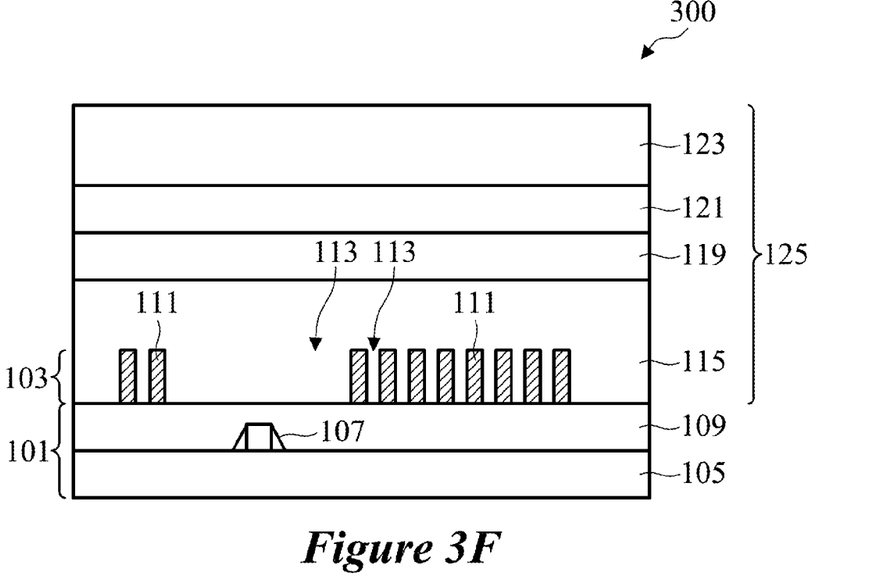

Referring to FIG. 3E, after polishing the top surface of the semiconductor structure 300, the insulating layer 117, the etch stop layer 301, and the bottom layer 115 are etched such that the insulating layer 117 layer and the etch stop layer 301 are completely removed from the bottom layer 115, and a thickness of the bottom layer 115 is reduced. In some embodiment, the etch process non-selectively etches the insulating layer 117, the etch stop layer 301, and the bottom layer 115. Due to non-selectivity of the etch process, the planar top surface of the semiconductor structure 300 illustrated in FIG. 3D is transformed into a planar top surface of the bottom layer 115. In some embodiments, the insulating layer 117, the etch stop layer 301, and the bottom layer 115 may be etched using similar methods as described above with reference to FIG. 1D and the description is not repeated herein.

In some embodiment, the insulating layer 117, the etch stop layer 301, and the bottom layer 115 may be optionally annealed before etching the insulating layer 117, the etch stop layer 301, and the bottom layer 115. The annealing process may improve the non-selectivity of the etch process for etching the insulating layer 117, the etch stop layer 301 and the bottom layer 115. In some embodiments, the annealing process alters the etch rates of the insulating layer 117, the etch stop layer 301, and the bottom layer 115, such that differences between the etch rates are reduced.

Referring to FIG. 3E, the first middle layer 119 is formed over the bottom layer 115. In some embodiments, the first middle layer 119 may be formed using similar methods as described above with reference to FIG. 1E and the description is not repeated herein. In some embodiments, a second middle layer 121 is formed over the first middle layer 119. In some embodiments, the second middle layer 121 may act a bottom anti-reflective coating (BARC) layer. In some embodiments, the second middle layer 121 may be formed using similar methods as described above with reference to FIG. 1E and the description is not repeated herein. In some embodiments, a top layer 123 is formed over the second middle layer 121. In some embodiment, the top layer 123 comprises a photoresist material and may be formed using spin-on coating, or the like. In some embodiments, the bottom layer 115, the first middle layer 119, the second middle layer 121, and the top layer 123 form the multi-layer mask 125. In other embodiments where the second middle layer 121 is omitted, the bottom layer 115, the first middle layer 119, and the top layer 123 form the multi-layer mask 125. In some embodiments, the multi-layer mask 125 is patterned to form a desired pattern in the bottom layer 115. Subsequently, the target structure 103 is patterned using the patterned bottom layer 115 layer as an etch mask.

Figure 4:
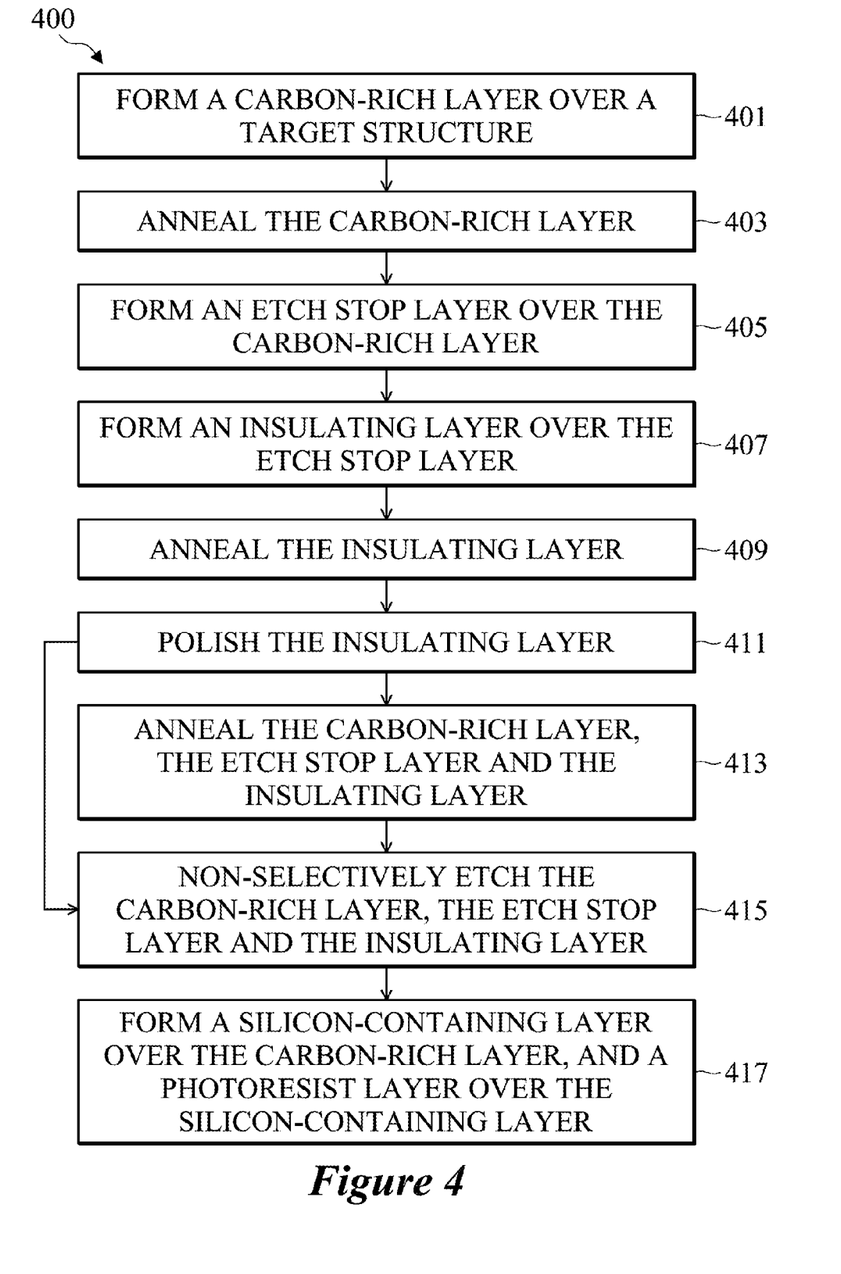
FIG. 4 is a flowchart illustrating a method of manufacturing a multi-layer mask in accordance with some embodiments.

FIG. 4 is a flowchart illustrating a method 400 of manufacturing a multi-layer mask in accordance with some embodiments. The method starts with step 401, where a carbon-rich layer (such as the bottom layer 115 illustrated in FIG. 3A) is formed over a target structure (such as the target structure 103 illustrated in FIG. 3A) as described above with reference to FIG. 3A. In step 403, the carbon-rich layer is annealed as described above with reference to FIG. 3A. In step 405, an etch stop layer (such as the etch stop layer 301 illustrated in FIG. 3B) is formed over the carbon-rich layer as described above with reference to FIG. 3B. In step 407, an insulating layer (such as the insulation layer 117 illustrated in FIG. 3C) is formed over the etch stop layer as described above with reference to FIG. 3C. In step 409, the insulating layer is annealed as described above with reference to FIG. 3C. In step 411, the insulating layer is polished as described above with reference to FIG. 3D. In step 413, the carbon-rich layer, the etch stop layer and the insulating layer are annealed as described above with reference to FIG. 3D. In other embodiments, step 413 may be omitted and the step 411 directly continues to step 415. In step 415, the carbon-rich layer, the etch stop layer, and the insulating layer are non-selectively etched as described above with reference to FIG. 3E. In step 417, a silicon-containing layer (such as the first middle layer 119 illustrated in FIG. 3F) is formed over the carbon-rich layer, and a photoresist layer (such as the top layer 123 illustrated in FIG. 3F) is formed over the silicon-containing layer as described above with reference to FIG. 3F. In alternative embodiments, in step 417, an organic BARC layer (such as the second middle layer 121 illustrated in FIG. 3F) may be optionally formed between the silicon-containing layer and the photoresist layer as described above with reference to FIG. 3F.

Various embodiments presented herein may provide several advantages. Embodiments such as described herein allow for forming a multi-layer mask having improved planarity. Various embodiments further allow for improving a planarity of multi-layer masks both globally (within a wafer) and locally (within a die). Multi-layer masks with improved planarity allow for further reducing the critical dimension (CD) and the depth of focus (DOF). Accordingly, features having reduced dimensions may be formed by using such multi-layer masks during lithography.

According to an embodiment, a method includes forming a first insulating layer over a substrate, the first insulating layer having a non-planar top surface, the first insulating layer having a first etch rate. A second insulating layer is formed over the first insulating layer, the second insulating layer having a non-planar top surface, the second insulating layer having a second etch rate, the second etch rate being greater than the first etch rate. The second insulating layer is polished, the polishing partially removing the second insulating layer. The first insulating layer and the second insulating layer are non-selectively recessed.

According to another embodiment, a method includes forming a target structure over a substrate. A first carbon-rich layer is formed over the target structure, the first carbon-rich layer having a first etch rate. The first carbon-rich layer is annealed. An insulating layer is formed over the first carbon-rich layer, the insulating layer having a second etch rate, the second etch rate being greater than the first etch rate. The insulating layer is annealed. The insulating layer is polished until at least a portion of the first carbon-rich layer is exposed. The first carbon-rich layer and the insulating layer are non-selectively etched.

According to yet another embodiment, a method includes coating a substrate with a first spin-on carbon (SOC) material, the first SOC material having a non-planar top surface. A first annealing process is performed on the first SOC material. An insulating layer is formed over the first SOC material, the insulating layer having a non-planar top surface. A second annealing process is performed on the insulating layer. A chemical-mechanical polishing (CMP) process is performed on the insulating layer, at least a portion of the insulating layer remaining over the first SOC material after performing the CMP process. The first SOC material and the insulation layer are non-selectively thinned to form a thinned first SOC material, the thinned first SOC material having a planar top surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first insulating layer over a substrate, the first insulating layer having a non-planar top surface, the first insulating layer having a first etch rate;

forming a second insulating layer over the first insulating layer, the second insulating layer having a non-planar top surface, the second insulating layer having a second etch rate, the second etch rate being greater than the first etch rate;

polishing the second insulating layer, the polishing partially removing the second insulating layer; and non-selectively recessing the first insulating layer and the second insulating layer.

2. The method of claim 1, further comprising annealing the first insulating layer.

3. The method of claim 1, further comprising annealing the second insulating layer.

4. The method of claim 1, further comprising, after polishing the second insulating layer, annealing the first insulating layer and the second insulating layer, wherein a difference between the second etch rate and the first etch rate is reduced.

5. The method of claim 1, wherein forming the first insulating layer comprises forming a carbon-rich layer.

6. The method of claim 1, wherein forming the second insulating layer comprises forming a carbon-rich layer.

7. The method of claim 1, wherein forming the second insulating layer comprises forming a dielectric layer.

8. The method of claim 1, further comprising forming a third insulating layer between the first insulating layer and the second insulating layer, the third insulating layer having a non-planar top surface, the third insulating layer having a third etch rate, the second etch rate being greater than the third etch rate.

9. The method of claim 1, further comprising:
after non-selectively recessing the first insulating layer and the second insulating layer, forming a silicon-containing layer over the first insulating layer; and
forming a photoresist layer over the silicon-containing layer.

10. A method comprising:
forming a target structure over a substrate;
forming a first carbon-rich layer over the target structure, the first carbon-rich layer having a first etch rate;
annealing the first carbon-rich layer;
forming an insulating layer over the first carbon-rich layer, the insulating layer having a second etch rate, the second etch rate being greater than the first etch rate;
annealing the insulating layer;
polishing the insulating layer until at least a portion of the first carbon-rich layer is exposed; and
non-selectively etching the first carbon-rich layer and the insulating layer.

11. The method of claim 10, wherein non-selectively etching the first carbon-rich layer and the insulating layer comprises completely removing the insulating layer.

12. The method of claim 10, wherein forming the first carbon-rich layer comprises forming a spin-on carbon (SOC) layer.

13. The method of claim 10, further comprising forming an etch stop layer between the first carbon-rich layer and the insulating layer, the etch stop layer having a third etch rate, the second etch rate being greater than the third etch rate.

14. The method of claim 13, further comprising, after polishing the insulating layer, annealing the insulating layer, the etch stop layer and the first carbon-rich layer.

15. The method of claim 13, wherein non-selectively etching the first carbon-rich layer and the insulating layer further comprises non-selectively etching the etch stop layer.

16. A method comprising:
coating a substrate with a first spin-on carbon (SOC) material, the first SOC material having a non-planar top surface;
performing a first annealing process on the first SOC material;
forming an insulating layer over the first SOC material, the insulating layer having a non-planar top surface;
performing a second annealing process on the insulating layer;
performing a chemical-mechanical polishing (CMP) process on the insulating layer, at least a portion of the insulating layer remaining over the first SOC material after performing the CMP process; and
non-selectively thinning the first SOC material and the insulating layer to form a thinned first SOC material, the thinned first SOC material having a planar top surface.

17. The method of claim 16, wherein forming the insulating layer comprises coating the first SOC material with a second spin-on carbon (SOC) material, an etch rate of the second SOC material being greater than an etch rate of the first SOC material.

18. The method of claim 16, further comprising, after performing the CMP process on the insulating layer, performing a third annealing process on the insulating layer and the first SOC material.

19. The method of claim 16, wherein non-selectively thinning the first SOC material and the insulating layer comprises completely removing the insulating layer over the first SOC material.

20. The method of claim 16, further comprising, before forming the insulating layer, forming an etch stop layer over the first SOC material.

* * * * *